(12) United States Patent
Wojtecki et al.

(10) Patent No.: US 10,782,613 B2
(45) Date of Patent: Sep. 22, 2020

(54) POLYMERIZABLE SELF-ASSEMBLED MONOLAYERS FOR USE IN ATOMIC LAYER DEPOSITION

(71) Applicant: International Business Machines Corporation, Armonk, NY (US)

(72) Inventors: Rudy J. Wojtecki, San Jose, CA (US); Noah F. Fine Nathel, Arlington, MA (US); Ekmini A. De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 15/956,870

(22) Filed: Apr. 19, 2018

(65) Prior Publication Data

US 2019/0322812 A1 Oct. 24, 2019

(51) Int. Cl.
| | |
|---|---|
| *G03F 7/20* | (2006.01) |
| *C23C 16/40* | (2006.01) |
| *C08G 79/04* | (2006.01) |
| *G03F 7/16* | (2006.01) |
| *G03F 7/38* | (2006.01) |
| *C09D 185/02* | (2006.01) |
| *C23C 16/455* | (2006.01) |
| *H01L 21/02* | (2006.01) |
| *C23C 16/04* | (2006.01) |

(52) U.S. Cl.
CPC ............. *G03F 7/20* (2013.01); *C08G 79/04* (2013.01); *C09D 185/02* (2013.01); *C23C 16/042* (2013.01); *C23C 16/405* (2013.01); *C23C 16/45525* (2013.01); *G03F 7/16* (2013.01); *G03F 7/2004* (2013.01); *G03F 7/38* (2013.01); *H01L 21/0228* (2013.01); *H01L 21/02181* (2013.01); *H01L 21/02186* (2013.01); *H01L 21/02189* (2013.01)

(58) Field of Classification Search
CPC ...................................................... G03F 7/2002
See application file for complete search history.

(56) References Cited

U.S. PATENT DOCUMENTS

| | | |
|---|---|---|
| 3,836,368 A | 9/1974 | Jun et al. |
| 4,562,141 A | 12/1985 | Tieke |
| (Continued) | | |

FOREIGN PATENT DOCUMENTS

| | | |
|---|---|---|
| CN | 103325943 A | 9/2013 |
| WO | 2017191932 A1 | 9/2017 |

OTHER PUBLICATIONS

Alaboson et al., "Templating Sub-10 nm Atomic Layer Deposited Oxide Nanostructures on Graphene via One-Dimensional Organic SelfAssembled Monolayers", Nano Letters, 2013, 13 (12), pp. 5763-5770.

(Continued)

*Primary Examiner* — Kathleen Duda
(74) *Attorney, Agent, or Firm* — Michael R. Roberts

(57) ABSTRACT

Self-assembled monolayers (SAMs) were selectively prepared on portions of a substrate surface utilizing compounds comprising a hydrogen-bonding group and polymerizable diacetylene group. The SAMs were photopolymerized using ultraviolet light. The pre-polymerized and polymerized SAMs were more effective barriers against metal deposition in an atomic layer deposition process compared to similar compounds lacking these functional groups.

19 Claims, 7 Drawing Sheets

(56) References Cited

U.S. PATENT DOCUMENTS

| | | | |
|---|---|---|---|
| 7,311,943 | B2 | 12/2007 | Jacobson |
| 7,531,293 | B2 | 5/2009 | Afzali-Ardakani et al. |
| 8,334,051 | B2 | 12/2012 | Ogawa |
| 9,012,891 | B2 | 4/2015 | Sung et al. |
| 9,163,307 | B2 | 10/2015 | Gleason et al. |
| 9,275,800 | B2 | 3/2016 | Ribble et al. |
| 2006/0060301 | A1 | 3/2006 | Lazovsky et al. |
| 2011/0294995 | A1 | 12/2011 | Huo et al. |
| 2013/0260560 | A1* | 10/2013 | Mayers .................. B82Y 10/00 438/694 |
| 2016/0202247 | A1 | 7/2016 | Tian et al. |
| 2017/0052447 | A1* | 2/2017 | Yamada ................ C07F 9/3808 |
| 2018/0012752 | A1 | 1/2018 | Tapily |

OTHER PUBLICATIONS

Alloisio et al., "Photopolymerization of diacetylene-capped gold nanoparticles", Phys. Chem. Chem. Phys., 2008, 10, 2214-2220.

Chan et al., "Polymeric Self-Assemhled Monolayers. 3. Pattern Transfer by Use of Photolithography, Electrochemical Methods, and an Ultrathin, Self-Assemhled Diacetylenic Resist", JACS, 1995, 117, pp. 5875-5876.

Jadhav et al., "Synthesis of a disulfide functionalized diacetylenic derivative of carbazole as building-block of polymerizable self-assembled monolayers", Chemical Papers 68 (2) 239-245 (2014).

Jadhav, "Self-assembled monolayers (SAMs) of carboxylic acids: an overview", Cent. Eur. J. Chem., 9(3), 2011, pp. 369-378.

Kim et al., "Polymeric Self-Assembled Monolayers. 2. Synthesis and Characterization of Self-Assembled Polydiacetylene Mono- and Multilayers", J. Am. Chem. Soc., 1995, 117, 3963-3967.

Li et al., "Photopolymerization of Self-Assembled Monolayers of Diacetylenic Alkylphosphonic Acids on Group-III Nitride Substrates", Langmuir, 2010, 26 (13), pp. 10725-10730.

Mackus et al., "The use of atomic layer deposition in advanced nanopatterning", Nanoscale, 2014, 6, 10941-10960.

Menzel et al., "Diacetylene polymerization in self-assembled monolayers: influence of the odd/even nature of the methylene spacer", Polymer, vol. 41, Issue 22, Oct. 2000, pp. 8113-8119.

Prashar, "Self Assembled Monolayers—A Review", International Journal of ChemTech Research, vol. 4, No. 1, pp. 258-265, Jan.-Mar. 2012.

Ramin et al., "Epoxy-Terminated Self-Assembled Monolayers Containing Internal Urea or Amide Groups", Langmuir 2015, 31, 2783-2789.

Tam-Chang et al., "Self-Assembled Monolayers on Gold Generated from Alkanethiols with the Structure RNHCOCHzSH", Langmuir, vol. 11, No. 11, 1995, pp. 4371-4382.

Wojtecki et al., "Monolayers for Use in Area Selective Atomic Layer Deposition", Abstract for presentation in a graduate course "Thin Films", San Jose State University, Feb. 20, 2018.

Wojtecki et al., "Reactive Monolayers for Use in Area Selective Atomic Layer Deposition", Abstract for The American Vacuum Society 18th International Conference on Metallurgical Coatings and Thin Films, Apr. 23-27, 2018.

China National Property Administration, International Search Report and Written Opinion, International application No. PCT/IB2019/051892, dated Jul. 3, 2019.

* cited by examiner

Apply SAM precursor

1. Optional PAB
2. Expose

Selective removal

ALD

Selective removal of SAM

Coat SAM precursor

1. Optional bake or rinse
2. Flood expose

1. Optional bake or rinse
2. ALD

Remove SAM

POLYMERIZABLE SELF-ASSEMBLED MONOLAYERS FOR USE IN ATOMIC LAYER DEPOSITION

STATEMENT REGARDING PRIOR DISCLOSURES BY THE INVENTOR OR A JOINT INVENTOR

The following disclosure(s) are submitted under 35 U.S.C. 102(b)(1)(A):
1. WOJTECKI, R. et al., "Reactive Monolayers for Use in Area Selective Atomic Layer Deposition", Abstract for The American Vacuum Society 18th International Conference on Metallurgical Coatings and Thin Films, Apr. 23-27, 2018.
2. WOJTECKI, R. et al., "Reactive Monolayers for Use in Area Selective Atomic Layer Deposition", Abstract for presentation in a graduate course "Thin Films", San Jose State University, Feb. 20, 2018.

BACKGROUND

The present invention relates to polymerizable self-assembled monolayers (SAMs) for use in atomic layer deposition (ALD), and more specifically, to methods of generating patterned layers by area-selective atomic layer deposition (AS-ALD), in which the SAM acts as a blocking layer, and deposition is confined substantially or exclusively to surfaces other than the top surface of the SAM.

Atomic layer deposition (ALD) is a chemical vapor deposition technique that produces atomically smooth and conformal coatings even on high aspect ratio features. This technique can deposit a wide range of materials—metals, nonmetals and their related oxides and nitrides through either thermal processes or plasma-enhanced processes (generally used in the deposition of transition metals).

The thermal deposition process generally requires two reaction steps per atomic layer deposited (an organometallic precursor followed by an oxidizing agent). In the first half cycle of an ALD process, the film surface is saturated with an organometallic precursor that reacts with surface groups generating covalent bonds with the surface. This reaction is self-limiting in that the half cycle will only lead to the formation of one layer of the functionalized organometallic. The second half-cycle involves the introduction of an oxidizing agent that generates reactive surface groups for the next ALD cycle. This method restricts film formation to the deposition of one atomic layer for each full ALD cycle (i.e., two ALD half cycles, also referred to herein simply as "ALD cycle"). Multiple ALD cycles are used to build the film thickness until a desired thickness is reached.

In an area-selective ALD (AS-ALD), deposition occurs only on selected surface areas of a substrate. One method of selectively blocking ALD deposition is area-deactivation. For example, lithographic polymers can be used to block specific reactive sites of a substrate surface. Other blocking materials can be selectively applied to specific surface areas of a substrate based on the reactivity of the blocking material with the material of the specific surface areas. As one example, organic small molecules can be used to block desired surface sites during ALD that are replenished after multiple ALD cycles. Alternatively, self-assembled monolayers (SAMs), comprised of long-chain organic small molecules, can selectively adsorb onto surfaces and provide a blocking layer toward ALD that may or may not require replenishment. Examples of materials used for SAMs include 1) alkyl silanes, which protect $SiO_2$ and $GeO_2$, 2) alkynes/alkenes, which protect H-terminated surfaces, 3) thiols, which protect bare metals, and 4) carboxylic/phosphonic acids, which protect metal oxides. Phosphonic acid SAMs, specifically, do not deposit on $SiO_2$ or bare metals. This allows selective deposition to $SiO_2$ on bare metal sites in the presence of adjacent metal oxide sites protected by one or more phosphonic acid SAMs.

Photopolymerizable diacetylenic moieties have been incorporated into the SAM-forming materials for improved robustness of SAMs against ALD deposition (L I, Feng et al., "Photopolymerization of Self-Assembled Monolayers of Diacetylenic Alkylphosphonic Acids on Group-III Nitride Substrates", Langmuir, 2010, 26 (13), pp 10725-10730). The diacetylene group allows for topochemical polymerization after formation of the initial SAM, typically by exposure of the initial SAM to ultraviolet light. For example, diacetylenic alkylphosphonic acids have been used as SAMs on group-III nitride surfaces and demonstrate improved robustness after exposure to ultraviolet (UV) radiation. Nevertheless, a need exists for self-assembly materials that provide even greater area selectivity of ALD depositions.

SUMMARY

Accordingly, a method is disclosed, comprising:
disposing a self-assembled monolayer, designated SAM, on a portion of a surface of a substrate, thereby forming a masked portion of the surface while leaving a portion of the surface unmasked, the SAM comprising a bound form of a compound of formula (1):

(1)

wherein
a is 1 or 2,
H' is a head group comprising a functional group capable of binding to said portion of the surface by electrostatic interactions and/or a covalent bond,
T' is a tail group covalently linked to the head group, the tail group comprising a hydrogen-bond-forming functional group, a polymerizable group, and a non-polar peripheral end group;
exposing the SAM to a radiation, thereby forming a polymerized SAM; and
depositing material selectively onto the unmasked portion of the surface using a process of atomic layer deposition, thereby forming a layered structure.

Also disclosed is the layered structure formed by the above-described method.

Further disclosed is another method, comprising:
disposing a self-assembled monolayer, designated SAM, on a surface of a substrate, the SAM comprising a bound form of a compound of formula (1):

(1)

wherein
a is 1 or 2,
H' is a head group comprising a functional group capable of binding to said portion of the surface by electrostatic interactions and/or a covalent bond, T' is a tail group covalently linked to the head group, the tail group comprising a hydrogen-bond-forming functional group, a polymerizable group, and a non-polar peripheral end group;

exposing the SAM pattern-wise to radiation, thereby forming a patterned SAM comprising exposed SAM and non-exposed SAM, the exposed SAM comprising a polymerized form of the compound;

selectively removing the non-exposed SAM, thereby forming unmasked regions of the surface of the substrate; and depositing a material selectively onto the unmasked regions of the substrate using a process of atomic layer deposition.

Another method is disclosed, comprising:

disposing a self-assembled monolayer on a portion of a substrate, thereby forming a masked portion of the substrate while leaving a portion of the substrate unmasked, wherein the self-assembled monolayer includes a moiety selected from the group consisting of photopolymerizable moieties, hydrogen bond-forming moieties, and combinations thereof; and depositing material selectively onto the unmasked portion of the substrate using a process of atomic layer deposition.

The above-described and other features and advantages of the present invention will be appreciated and understood by those skilled in the art from the following detailed description, drawings, and appended claims.

DETAILED DESCRIPTION

Figure 1A:
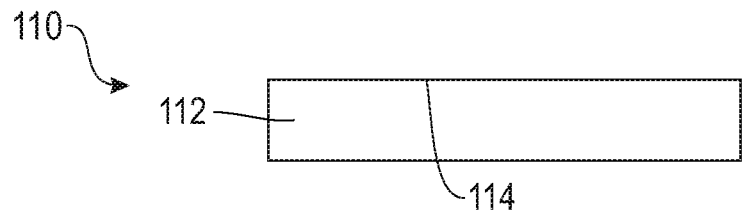
FIGS. 1A-1F are cross-sectional layer diagrams showing a method of forming a layered structure using atom layer deposition (ALD).

The methods disclosed herein utilize compounds capable of forming a polymerized, crosslinked self-assembled monolayer (SAM) disposed on a top surface of a layered substrate (e.g., a silicon wafer) or a portion thereof. These compounds are referred to herein as SAM-forming compounds. The top surface of the SAM resists deposition of an ALD precursor, meaning a material delivered in the first half-cycle of the ALD process (e.g., dimethyl zinc). The ALD precursor is converted to an ALD product (e.g., ZnO) in the second half-cycle. Thus, the SAM serves to mask regions of the substrate surface to the ALD film-forming process. As a result, nucleation of the ALD product occurs predominantly or exclusively in unmasked regions of the substrate (i.e., substrate surfaces having no SAM disposed thereon). ALD processes can involve hundreds of ALD cycles to achieve a desired thickness of the deposited material. Herein, a more effective SAM permits a larger number of ALD cycles before unwanted levels of ALD product are formed in the masked regions. The examples further below demonstrate that a substantially higher number of ALD cycles are possible using the disclosed methods and materials, an important attribute for minimizing defects during semiconductor device fabrication, and for potentially providing patterns having smaller critical dimensions.

Herein, a SAM is a layer formed by self-assembly of a compound. The compound is polymerizable. The monolayer has a thickness corresponding to the length of one molecule of the compound in the close-packed structure of the monolayer. The close packing is assisted by a functional group of the compound that binds to surface groups of the substrate by electrostatic interactions and/or one or more covalent bonds. The portion of the compound that binds to the substrate surface is referred to herein as the "head" of the compound. The remainder of the compound is referred to as the "tail". The tail extends from the head of the compound to the atmosphere interface at the top surface of the SAM. The tail has a non-polar peripheral end group at the atmosphere interface. For this reason, a well-formed SAM having few defects in its close packed structure can displays high contact angles.

The head of the SAM-forming compound can selectively bind to a portion of a substrate top surface that comprises regions of different compositions, leaving other portions of the substrate top surface having none of, or substantially none of, the SAM-forming compound disposed thereon. In this instance, a patterned initial SAM can be formed in one step by immersing the substrate in a solution of the given SAM-forming compound dissolved in a suitable solvent.

Herein, ultraviolet radiation can have a wavelength from about 4 nm to 450 nm. Deep ultraviolet (DUV) radiation can have a wavelength from 124 nm to 300 nm. Extreme ultraviolet (EUV) radiation can have a wavelength from about 4 nm to less than 124 nm.

The SAM-forming compound has a structure according to formula (1):

(1)

wherein a is 1 or 2,

H' is a head group comprising a functional group capable of binding to a given selected top surface of a substrate by electrostatic interactions and/or a covalent bond, T' is a tail group covalently linked to the head group, the tail group comprising a hydrogen-bond-forming functional group, a polymerizable group, and a non-polar peripheral end group.

The SAM-forming compound can have 1 or 2 tail groups. Each of the tail groups can comprise one or more hydrogen bond-forming groups and one or more polymerizable groups. The SAM-forming compounds can be used singularly or in combination.

In an embodiment, the SAM-forming compounds have one tail group. These compounds have a structure in accordance with formula (2):

(2), wherein

H' is a head group comprising a functional group capable of binding to a given selected top surface of a substrate by electrostatic interactions and/or a covalent bond, S'—B'—S"—P'-E' is a tail group which is covalently linked to H', S' is a first spacer group comprising at least one carbon, B' is a moiety comprising a hydrogen bond-forming functional group, S" is a second spacer group comprising at least one carbon, P' is a moiety comprising a polymerizable group, and E' is a non-polar peripheral end group comprising 1-20 carbons.

Non-limiting exemplary functional groups for the head group H' include: phosphonic acid group (*—P(=O)(—OH)$_2$ and salts thereof, carboxylic acid group (*—C(=O)OH) and salts thereof, sulfonic acid group (*—S(=O)$_2$OH) and salts thereof, sulfinic acid group (*—S(=O)OH) and salts thereof, alcohol (*—OH), thiol (*—SH), disulfide (*—S=S—*), alkene (*—C=C—*), alkyne (*—C≡C—*), silanes, and heterocycles (e.g., imidazoles, oxazoles, thiazoles, and the like). Other non-limiting head groups include phosphine oxide, phosphite, phosphate, phosphazine, azide, hydrazine, sulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithiocarboxylate, xanthate, thioxanthate, alkylthiophosphate, dialkyldithiophosphate, hydroxamic acid. The foregoing head groups can be used singularly or in combination. In an embodiment, the head group comprises a member of the group consisting of phosphonic acid group (*—P(=O)(—OH)$_2$ and salts thereof, carboxylic acid group (*—C(=O)OH) and salts thereof, sulfonic acid group (*—S(=O)$_2$ OH) and salts thereof, sulfinic acid group (*—S(=O)OH) and salts thereof, alcohol (*—OH), thiol (*—SH), alkene (*—C=C—*), alkyne (*—C≡C—*), silanes, and combinations thereof.

Herein, an atomic center having a bond to an asterisk means the atomic center is covalently linked to another unspecified atomic center of the chemical structure.

Salts of the above-mentioned acid groups comprise a negative-charged group (e.g., phosphonate group (*—P(=O)(—O$^-$)$_2$, carboxylate group (*—C(=O)O$^-$), sulfonate group S(=O)$_2$O$^-$), and sulfinate group (*—S(=O)O$^-$)), which is ionically associated with a positive-charged counterion such as, for example Li$^+$, Na$^+$, K$^+$, Rb$^+$, or Cs$^+$.

Spacer groups S' and S" are independent divalent non-cyclic hydrocarbon groups, more specifically branched and non-branched $C_1$-$C_{20}$ acyclic aliphatic hydrocarbon groups. Exemplary non-limiting divalent acyclic aliphatic groups include methylene, ethan-1,2-diyl (*—CH$_2$CH$_2$—*), propan-1,3-diyl (*—CH$_2$CH$_2$CH$_2$—*), propan-1,2-diyl (*—CH(CH$_3$)CH$_2$—*), butan-1,4-diyl (*—CH$_2$(CH$_2$)$_2$CH$_2$—*), butan-1,3-diyl (*—CH$_2$CH$_2$CH(CH$_3$)—*), pentan-1,5-diyl (*—CH$_2$(CH$_2$)$_3$CH$_2$—*), and hexan-1,6-diyl (*—CH$_2$(CH$_2$)$_4$CH$_2$—*), heptan-1,7-diyl (*—CH$_2$(CH$_2$)$_5$CH$_2$—*), octan-1,8-diyl (*—CH$_2$(CH$_2$)$_6$CH$_2$—*), and nonan-1,9-diyl (*—CH$_2$(CH$_2$)$_7$CH$_2$—*), (*—CH$_2$(CH$_2$)$_8$CH$_2$—*), (*—CH$_2$(CH$_2$)$_9$CH$_2$—*), (*—CH$_2$(CH$_2$)$_{10}$CH$_2$—*), (*—CH$_2$(CH$_2$)$_{11}$CH$_2$—*), and (*—CH$_2$(CH$_2$)$_{12}$CH$_2$—*).

In an embodiment, the tail of the SAM-forming compound comprises no rings. In another embodiment, the tail group comprises 10 to 50 methylene groups (*—CH$_2$—*).

The hydrogen bond-forming group B' comprises a hydrogen donating portion (e.g., *—NH—*and a hydrogen receptor portion (e.g., a carbonyl group)). Non-limiting exemplary hydrogen bond-forming functional groups include amide (*—NH—C(=O)—*), urea (*—NH—C(=O)—NH—*), and urethane (*—NH—C(=O)—O—*). The B' group can comprise one or more of the foregoing functional groups.

No restriction is placed on the divalent polymerizable group P' as long as the properties of the resulting SAM are not adversely affected. Preferred P' groups comprise one or more polymerizable groups selected from the group consisting of ethen-1,1-diyl group ((*—)$_2$C=CH$_2$), ethen-1,2-diyl group (*—C(H)=C(H)—*), ethyn-1,2-diyl group (*—C≡C—*), and combinations thereof. More specific P' groups comprise a member of the group consisting of poly-enes, poly-ynes, and combinations thereof. In an embodiment, P' comprises a member of the group consisting of 1,3-butadien-1,4-diyl group (*—C=C(H)—C(H)=C—*), butadiyn-1,4-diyl group (*—C≡C—C≡C—*), and combinations thereof.

End group E' comprises carbon and a member of the group selected from hydrogen, fluorine, and combinations thereof. Non-limiting end groups E' include methyl, ethyl, n-propyl, isopropyl, n-butyl, sec-butyl, iso-butyl, tert-butyl, n-pentyl, iso-pentyl, neo-pentyl, tert-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl, n-eicosyl, and any of the foregoing groups wherein one or more hydrogens is replaced with fluorine. In an embodiment, E' is n-dodecyl.

Herein, a perfluorinated group is a functional group whose molecular formula contains only the elements carbon and fluorine. Preferably, when fluorine is present, adjacent carbons of E' are linked by a single bond (i.e., E' is a perfluorinated alkyl group, meaning an alkyl group in which each hydrogen is replaced by fluorine). Exemplary E' groups include trifluoromethyl (*—CF$_3$), perfluoroethyl (*—CF$_2$CF$_3$), perfluoro-n-propyl (*—CF$_2$CF$_2$CF$_3$), perfluoroisopropyl (*—CF(CF$_3$)$_2$), perfluoro-n-butyl (*—CF$_2$CF$_2$CF$_2$CF$_3$), perfluoroisobutyl (*—CF$_2$CF(CF$_3$)$_2$), perfluoro-n-pentyl (*—CF$_2$(CF$_2$)$_3$CF$_3$), perfluoro-n-hexyl, perfluoro-n-heptyl, perfluoro-n-octyl, perfluoro-n-nonyl, perfluoro-n-decyl, perfluoro-n-undecyl, perfluoro-n-dodecyl, and the like.

Other more specific SAM-forming compounds have a structure according to formula (3):

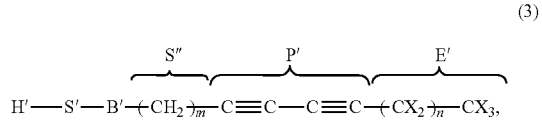

(3)

$$H'—S'—B'—(CH_2)_{\overline{m}}—\underset{S''}{\underbrace{C≡C—C≡C}}—\underset{P'}{\underbrace{(CX_2)_{\overline{n}}}}—\underset{E'}{\underbrace{CX_3,}}$$

wherein m is a positive integer having a value of 4 to 20, n is a positive integer having a value of 0 to 19, H' is a head group comprising a functional group capable of binding to a given selected top surface of a substrate by electrostatic interactions and/or a covalent bond, S' is a spacer group comprising at least one carbon, B' is a moiety comprising a hydrogen bond-forming group, and each X is an independent substituent selected from the group consisting of hydrogen and fluorine.

Examples of S", P', and E' of formula (2) mentioned further above are labeled in formula (3).

In the above structure, the diacetylene group is covalently linked to two independent divalent alkylene chains, each comprising 4-20 methylene groups. The peripheral alkylene chain is terminated with a methyl group.

Still more specific SAM-forming compounds have a structure according to formula (4):

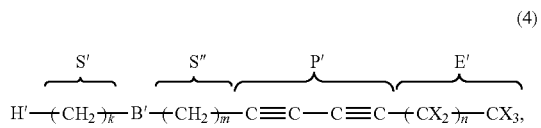

(4)

wherein
k is a positive integer having a value of 1 to 10,
m is a positive integer having a value of 4 to 20,
n is a positive integer having a value of 4 to 20,
H' is a head group comprising a functional group capable of binding to a given selected top surface of a substrate by electrostatic interactions and/or a covalent bond,
B' is a moiety comprising a member selected from the group consisting of amide, urea, and urethane, and
each X is an independent substituent selected from the group consisting of hydrogen and fluorine.

Examples of S', S", P', and E' of formula (2) mentioned further above are labeled in formula (4).

In an embodiment, each X is hydrogen. In another embodiment, each X is fluorine.

In each of the following methods, the SAM acts as a mask to block deposition of an ALD precursor over portions of the substrate surface occupied by the SAM.

Method 1

A first method of forming a layered structure by ALD is illustrated in the cross-sectional layer diagrams of FIGS. 1A-1F. This method utilizes a polymerizable SAM as a resist to mask a surface during atomic layer deposition. Substrate 110 of FIG. 1A can comprise one or more layers. For simplicity, substrate 110 is shown having one layer, layer 112 (e.g., a copper foil). Layer 12 has a top surface 114 capable of associating ionically or covalently with a head group of a SAM-forming compound.

The choice of head group of the SAM-forming compound depends on the surface groups of top surface 114. For purposes of illustration only not meant to be limiting, if layer 112 comprises copper metal, top surface 114 can comprise oxides of copper formed during oxygen plasma cleaning of the copper foil. In this instance, the head group preferably comprises a phosphonic acid group, which interacts strongly with copper oxide surface groups. Other head groups may be preferred for other metal oxides.

Figure 1B:
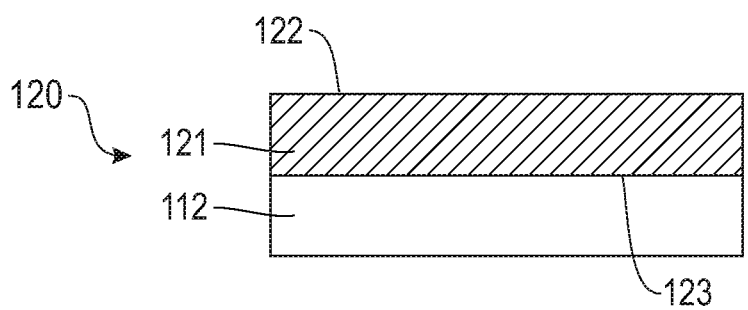

The SAM-forming compound can be applied to top surface 114 using any suitable coating technique (e.g., dip coating the substrate using a solution of the SAM-forming compound in a suitable solvent, spin casting a solution of the SAM-forming compound in a suitable solvent, vapor deposition of the SAM-forming compound), thereby generating structure 120 (FIG. 1B). Structure 120 comprises initial SAM layer 121 disposed on layer 112. Initial SAM layer 121 is a monolayer of the SAM-forming compound, whose head group is bound by electrostatic and/or covalent interactions to surface groups of layer 112 at interface 123 (e.g., phosphonic acid head group(s) of the SAM-forming compound bind with $CuO/CuO_2$ surface groups of layer 112). Initial SAM layer 121 comprises top surface 122. Initial SAM layer 121 comprises a hydrogen bond-forming group in the region between interface 123 and top surface 122 that assists in stabilizing and close packing the tail portion of the bound SAM-forming compound. Initial SAM layer 121 also contains a polymerizable group in the region between interface 123 and top surface 122. Top surface 122 is non-polar and resistant to deposition of a material delivered by ALD.

SAM layer 121 can be treated with an optional post-application bake (PAB) and/or an optional solvent rinse under suitable conditions of time and temperature before pattern-wise exposure. The optional PAB treatment is typically performed at a temperature of 50° C. to 250° C. for a period of 1 second to 10 minutes, more specifically 90° C. to 130° C. for about 1 minute under an inert atmosphere (e.g., nitrogen, helium or argon). The PAB can be used to dry the film of excess solvent, remove unwanted or excess organic ligand, and/or generate covalent bonds linking the head groups to oxides of top surface 114. The thermally treated SAM layer 121 has a thickness of 1 monolayer of the SAM-forming compound.

Figure 1C:
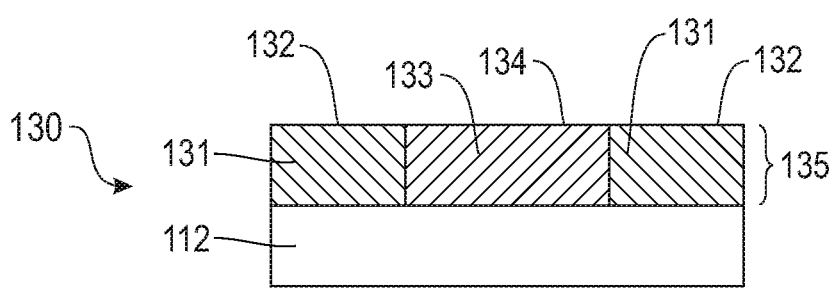

Initial SAM layer 121 or baked initial SAM layer (not shown) is then exposed pattern-wise through a mask having a desired pattern using a high energy radiation capable of inducing polymerization of the polymerizable P' groups of the SAM layer, thereby generating structure 130 (FIG. 1C). Structure 130 comprises exposed SAM layer 135 disposed on layer 112. Exposed SAM layer 135 comprises i) exposed SAM features 131 comprising polymerized bound SAM-forming compound and having top surface 132 and ii) non-exposed SAM features 133 comprising non-polymerized bound SAM-forming compound and having top surface 134. Top surface 132 and top surface 134 are non-polar.

Non-limiting examples of high-energy radiation for inducing polymerization of the SAM include deep ultraviolet (DUV) light, excimer laser, x-ray, or extreme ultraviolet (EUV) light. An ultraviolet light exposure dose is preferably on the order of about 1 $mJ/cm^2$ to about 500 $mJ/cm^2$, more preferably about 10 $mJ/cm^2$ to about 100 $mJ/cm^2$. The exposure can be performed by conventional lithography or by liquid immersion lithography (e.g., using EUV exposures). The liquid immersion exposure device uses a medium such as water, a hydrocarbon liquid, and/or a fluorinated liquid between the mask and the SAM layer in the optical path, which causes less absorption of high energy radiation and enables more efficient fine processing in terms of numerical aperture and effective wavelength. In this case, a protective film that is insoluble in water can be applied beforehand to the SAM layer. In an embodiment, the exposure is performed using an ultraviolet wavelength between 100 nm and 300 nm.

Exposed SAM layer 135 can be treated with an optional post-exposure bake (PEB) and/or an optional solvent rinse under suitable conditions of time and temperature before selective removal of non-exposed SAM features. The optional PEB can be performed at a temperature of 50° C. to 250° C. for 1 second to 10 minutes, more specifically 80° C. to 140° C. for about 1 to 5 minutes under an inert atmosphere.

The SAM layer can be rinsed before or after the exposure, the PAB, and/or the PEB with a solvent (e.g., water, aqueous solutions, including water/alcohol mixtures, and organic solvents). Rinses can be performed at or near room temperature (e.g., 10° C. to 50° C.) for a period of 1 second to 1 hour. The optional baking (PAB and/or PEB) treatments and/or optional rinsing treatments can enhance the solubility difference of the exposed SAM features compared to the non-exposed SAM features.

Figure 1D:
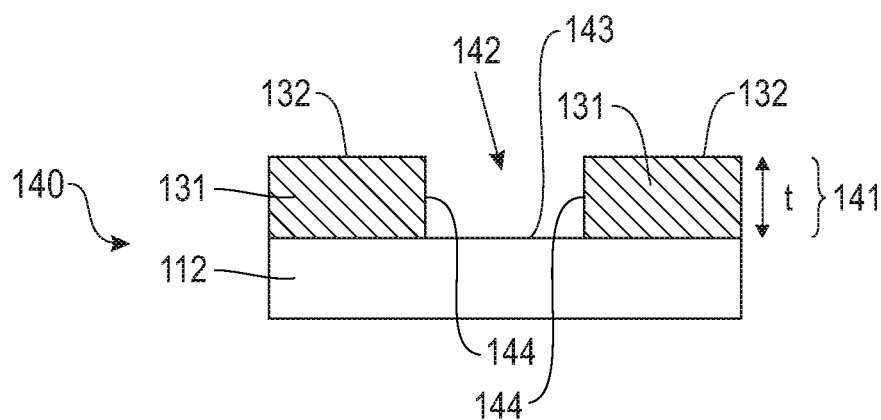

Non-exposed SAM features 133 can be selectively removed using any suitable method and materials (e.g., developing layer 135 in an organic solvent capable of selectively dissolving non-exposed SAM features 133, leaving exposed SAM features 131), thereby forming structure 140 (FIG. 1D). Structure 140 comprises patterned layer 141 comprising exposed SAM features 131 and trenches 142. Trenches 142 have bottom surface 143 and sidewalls 144 of height t corresponding to the thickness of one monolayer of the polymerized SAM-forming compound.

Figure 1E:
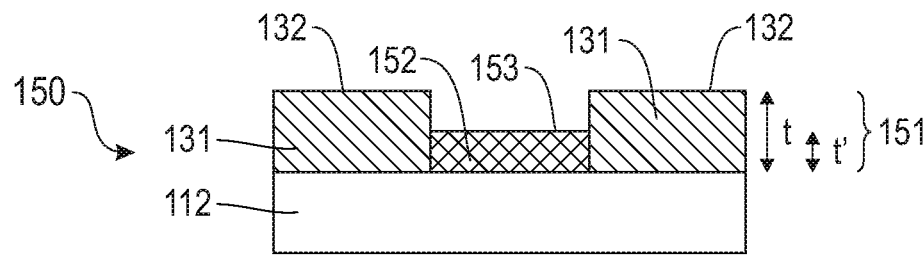

Structure 140 is then subjected to an ALD process, which deposits an ALD precursor selectively on bottom surface 143, leaving none or substantially none of ALD precursor disposed on top surface 132. That is, the ALD precursor has a high affinity for bottom surface 143 and a low affinity, or more preferably no affinity, for top surface 132. The first ALD cycle forms one monolayer of ALD product on bottom surface 143, and each successive ALD cycle forms another monolayer of ALD product on the previous ALD monolayer. The ALD process can be repeated for as many cycles as necessary to generate a desired thickness t' of ALD product, thereby forming structure 150 (FIG. 1E). Structure 150 comprises patterned layer 151 comprising exposed SAM features 131 having thickness t and ALD features 152 containing ALD product disposed on bottom surface 143 in trench areas 142. ALD features 152 have top surface 153 and thickness t', which can be less than (shown), greater than (not shown), or equal to (not shown) the thickness t of exposed SAM features 131. Preferably, top surface 132 of exposed SAM features 131 has none, or substantially none, of the ALD product disposed thereon.

A given ALD cycle can include one or more chemical transformations of an initially deposited ALD precursor. For example, an ALD cycle can involve initial delivery of a low boiling organometallic compound (e.g., dimethyl zinc, boiling point 46° C.), which is converted in a second stage of the ALD cycle to a metal oxide (e.g., ZnO) using water vapor. A given ALD precursor can be a metal, an organometallic compound, an inorganic compound, or an organic compound. Each ALD cycle of the ALD process can form the same product or a different product.

Figure 1F:
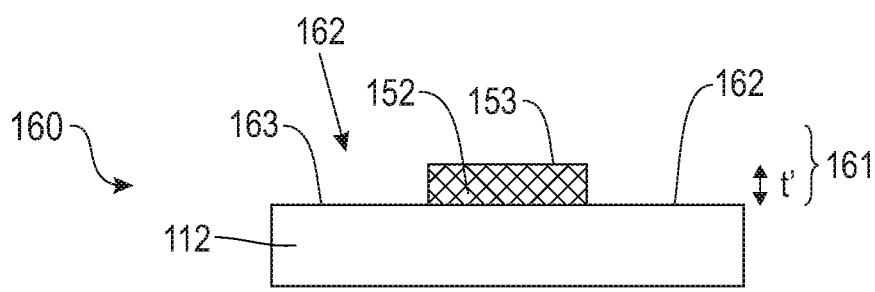

Exposed SAM features 131 can then be selectively removed, leaving structure 160 (FIG. 1F). Structure 160 comprises patterned layer 161 comprising ALD features 152 disposed on layer 112 of substrate 110. Patterned layer 161 also includes trenches 162 having bottom surfaces 163 of substrate 110. The selective removal of the exposed SAM features 131 can be performed using known techniques, including but not limited to solvent stripping and oxygen plasma etching. An etch process used to remove exposed SAM features 131 can also selectively remove material underlying SAM features 131, thereby forming a relief pattern within the substrate (not shown).

Method 2

In this method, the head group of the SAM-forming compound has preferential affinity for, and selectively adsorbs to, a portion of a top surface of a substrate that comprises two or more regions of different chemical composition.

Figure 2A:
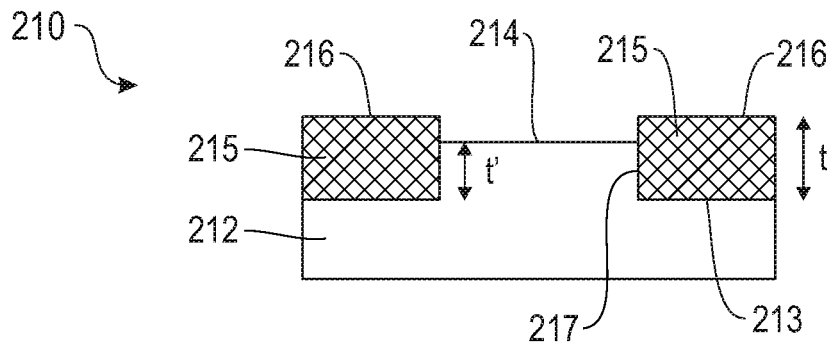
FIGS. 2A-2E are cross-sectional layer diagrams showing a second method of forming a layered structure using ALD.

Substrate 210 (FIG. 2A) is a multi-layered substrate comprising features 215 in contact with bottom layer 212. Bottom layer 212 has top surface 214. Features 215 can be disposed on top surface 214 (not shown), or extend into bottom layer 212 (shown). Features 215 have top surface 216, bottom surface 213, and sidewall 217. In this non-limiting example, bottom surface 213 and sidewall 217 have contact with underlying layer 212. Top surface 216 and top surface 214 of layer 212 have contact with an atmosphere and are compositionally distinct. In this example, features 215 are shown partially embedded in layer 212, and height t' is less than the thickness t of features 215. Height t' can be greater than or equal to zero. Height t' can be greater than t (not shown), equal to t (not shown), or less than t (shown).

As a non-limiting example, layer 212 can be a silicon layer having a top surface 214 comprising $SiO_2$, and features 215 can be a copper line pattern whose top surfaces 216 comprise CuO and/or $CuO_2$. In this instance, a SAM-forming compound comprising a phosphonic acid head group would be preferred, owing to its strong binding properties with CuO and/or $CuO_2$ of top surface 216 and weak binding properties to $SiO_2$ of top surface 214.

Figure 2B:
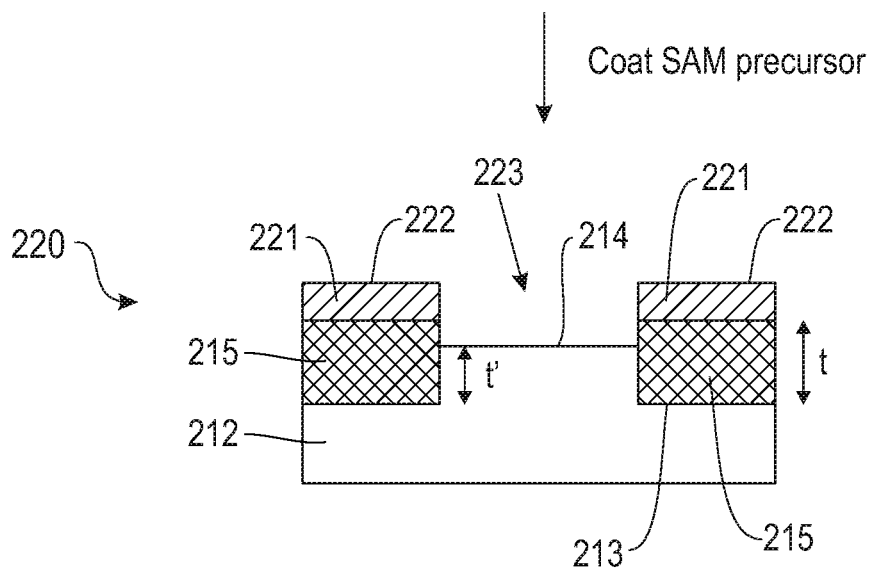

A SAM-forming compound is then applied to substrate 210, thereby forming structure 220 (FIG. 2B). Structure 220 comprises a pattern of initial SAM features 221 selectively disposed on features 215. Structure 220 also comprises trenches 223 comprising bottom surfaces 214 having none of, or substantially none of, the SAM-forming compound disposed thereon. Trenches 223 separate initial SAM features 221. Initial SAM features 221 have a thickness equal to one monolayer of the SAM-forming compound. As in the previous method, the initial SAM features can be given an optional post-application bake and/or a post-application solvent rinse.

Figure 2C:
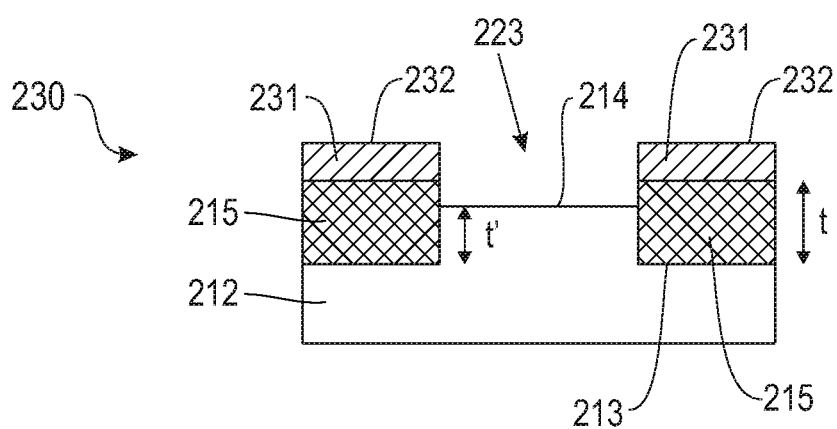

Flood exposure of structure 220 to a high energy radiation before or after the optional bake and/or rinse produces structure 230 (FIG. 2C). Structure 230 comprises exposed SAM features 231 having top surfaces 232, which are separated by trenches 223 having bottom surfaces 214. Bottom surfaces 214 have none of, or substantially none of, the SAM-forming compound disposed thereon. Exposed SAM features 231 comprise polymerized SAM-forming compound. Top surfaces 232 are non-polar. The exposed SAM features can be given an optional post-exposure bake and/or a post-exposure solvent rinse.

Figure 2D:
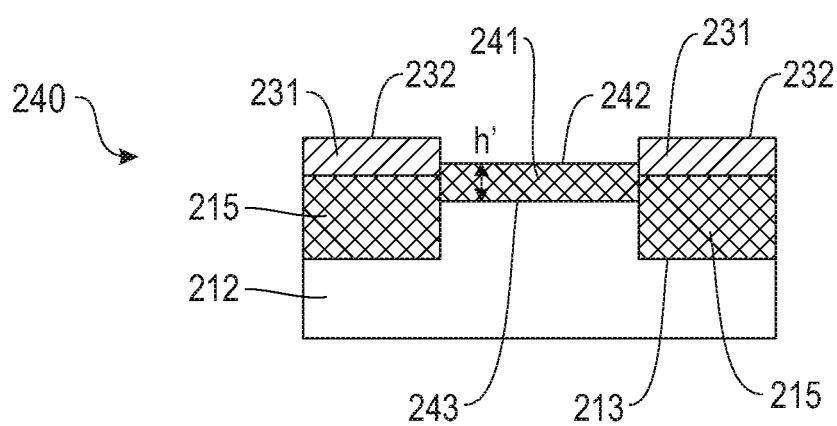

Structure 230 is then subjected to an ALD process that deposits an ALD precursor in the first half-cycle selectively on bottom surfaces 214 of trenches 223, forming structure 240 (FIG. 2D). The deposited ALD precursor is then converted to ALD product in the second half-cycle. Structure 240 has none or substantially none of the ALD product disposed on top surfaces 232 of exposed SAM features 231. The ALD precursor has preferential affinity for bottom surface 214 and a low affinity, or more preferably no affinity, for top surfaces 232. The ALD process can include as many ALD cycles as necessary to generate a desired thickness h' of ALD product. ALD features 241 comprise ALD product and have top surfaces 242, which can be below (shown), above (not shown), or coplanar with top surfaces 232. Bottom surfaces 243 of ALD features 241 are in contact with layer 212.

Figure 2E:
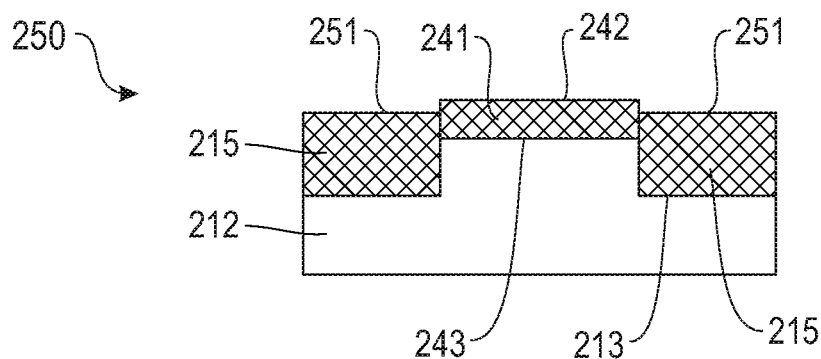

The exposed SAM features 231 can then be selectively removed, leaving structure 250 (FIG. 2E). In this example, structure 250 comprises a pattern of ALD features 241 in contact with layer 112 that are separated by features 215 of substrate 210. Features 215 of structure 250 have top surfaces 251, which can be below (shown), above (not shown), or coplanar with top surface 242 of ALD features 241. Selective removal of exposed SAM features 231 can also include removing material underlying exposed SAM features 231, including material of features 215 and bottom layer 112 (not shown).

Substrates

The substrate is a layered structure comprising one or more layers and has a top surface. The substrate, and more particularly the surface of the substrate, can comprise inorganic or organic materials such as metals, carbon, and/or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can comprise a dielectric material such as, for example, $SiO_2$, $TiO_2$, $Al_2O_3$, $Ta_2O_5$ and polymers (e.g., polyimides, polyamides, polyethylenes). The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Formulations for SAM Layers

Also disclosed are compositions for preparing a SAM layer. The compositions comprise a solvent and 0.1-5 wt % of a SAM-forming compound in contact with the solvent, wherein wt % is based on total weight of the composition. The SAM-forming compound can be dissolved or dispersed in the solvent. The compositions are suitable for forming a SAM layer comprising the SAM-forming compound. Exemplary solvents include, but are not limited to: toluene, xylene, dichloromethane (DCM), chloroform, carbon tetrachloride, ethyl acetate, butyl acetate, amyl acetate, propylene glycol monomethyl ether acetate (PGMEA), propylene glycol monomethyl ether (PGME), ethoxyethyl propionate, anisole, ethyl lactate, diethyl ether, dioxane, tetrahydrofuran (THF), acetonitrile, acetic acid, amyl acetate, n-butyl acetate, γ-butyrolactone (GBL), acetone, methyl isobutyl ketone, 2-heptanone, cyclohexanone, methanol, ethanol, 2-ethoxyethanol, 2-butoxyethanol, iso-propyl alcohol, n-butanol, N,N-dimethylformamide (DMF), N,N-dimethylacetamide, pyridine, and dimethylsulfoxide (DMSO). The solvents can be used singularly or in combination.

The solution can be applied to a top surface of a substrate using any suitable coating technique (e.g., dip-coating, spin coating) followed by removal of the solvent, thereby forming an initial SAM layer. The SAM layer has a top surface in contact with an atmosphere and a bottom surface in contact a selected surface of the substrate to which the SAM-forming compound has preferential affinity.

In general, the SAM can have a thickness of about 0.5 to about 20 nanometers, more particularly about 0.5 to about 10 nanometers, and even more particularly about 0.5 to about 2 nanometers.

Annealing Conditions

The degree of selectivity of the SAM to deactivate a given substrate surface to ALD deposition is a function of the chemical structure of the tail of the SAM-forming compound, the nature of the binding of the head group to the substrate surface (ionic or covalent), the presence of any solvent in the SAM layer, annealing conditions (e.g., temperature, environment, and annealing time) used to achieve close packing, the degree of polymerization achieved, and the SAM interface properties (e.g., SAM-air interface). These parameters can be adjusted to optimize the resistance of the SAM to deposition of a given ALD precursor.

Self-assembly of the SAM layer can occur during SAM layer formation and/or during a post-application annealing step (e.g., a subsequent thermal annealing process or solvent annealing process). Thermal annealing processes include annealing at a constant temperature and thermal gradient annealing. The thermal annealing step can be carried out at a temperature of between about 80° C. and about 350° C., more preferably between about 120° C. and about 350° C. The thermal annealing can be performed for a period between about 1 second and about 24 hours, and more particularly, between about 1 minute and about 20 minutes.

Selective Removal

The selective removal of the SAM features can be carried out by any suitable process (e.g., a thermal bake for thermally decomposable materials, a reactive ion etch process, dissolution in a selective solvent, ultraviolet exposure, or combinations of the foregoing). The selective removal can include dry-etching such as plasma etching and/or wet-etching using selective solvents and/or vapors. Typically, dry etching processes using a suitable gas ($O_2$) are employed for etching at sub-50 nm dimensions. Selectively removing SAM features creates a relief pattern that can be transferred into the underlying substrate.

Prior to the selective removal of the SAM features and/or transfer, the SAM features can be optionally chemically modified to improve properties necessary for the selective removal, such as etch resistance or mechanical properties. Etch resistant materials can be applied to a substrate surface, a surface of a SAM feature, and/or a surface of the ALD features for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

A chemical modification can be accomplished by a variety of known methods. For example, chemical agents can be used to bind or chemically couple to functional groups of the SAM to effect, for example, increased solubility property differences that can advantageously be used to selectively remove SAM features.

Selective removal of the SAM features can remove an underlying material of the substrate and/or resist.

Utility

The above-described methods can be used to form layered structures comprising patterned layers of metals, metal oxides, nitrides or polysilicon. The methods advantageously provide structural features having reduced feature size and good uniformity.

The following examples illustrate the preparation of SAMs and their effectiveness in deactivating an oxygen plasma cleaned copper surface to ALD deposition of an organozinc compound, which serves as a precursor to zinc oxide.

EXAMPLES

Materials used in the following examples are listed in Table 1.

TABLE 1

| ABBREVIATION | DESCRIPTION | SUPPLIER |
| --- | --- | --- |
| | Diethyl (2-cyanoethyl)phosphonate | Sigma-Aldrich |
| | 10,12-Pentacosadiynoic acid | Sigma-Aldrich |
| | Sodium borohydride | Sigma-Aldrich |
| | Cobalt chloride hexahydrate | Sigma-Aldrich |
| THF | Tetrahydrofuran | Sigma-Aldrich |
| EDCI | 1-Ethyl-3-(3-dimethylaminopropyl)carbodiimide | Sigma-Aldrich |
| DMAP | 4-Dimethylaminopyridinee | Sigma-Aldrich |
| DMF | N,N-Dimethylformamide | Sigma-Aldrich |
| ODPA | Octadecyl phosphonic acid | Sigma-Aldrich |

TABLE 1-continued

| ABBREVIATION | DESCRIPTION | SUPPLIER |
| --- | --- | --- |
| PFDA | Perfluorinated dodecanoic acid | Sigma-Aldrich |
| SA | Stearic acid | Sigma-Aldrich |
| HODA | N-hydroxy-octadecanamide | Sigma-Aldrich |
| MHODA | N-Methyl-N-hydroxy-octadecanamide | Sigma-Aldrich |
| OMCTS | Octamethylcyclotetrasiloxane | Sigma-Aldrich |

Syntheses (3-(pentacosa-10,12-diynamido)propyl)phosphonic acid (DA) was synthesized in three steps from commercially available diethyl (2-cyanoethyl)phosphonate and 10,12-pentacosadiynoic acid.

A. Preparation of diethyl (3-aminopropyl)phosphonate (C-1)

Diethyl (2-cyanoethyl)phosphonate (3.24 g, 17.0 mmol, 1.0 equivalent) was reduced with sodium borohydride (9.00 g, 237 mmol, 14.0 equivalents) and cobalt chloride hexahydrate (0.81 g, 3.4 mmol, 20 mol %) in a 1:1 THF/water mixture (65 mL, 0.1 M) at 0° C. and allowed to warm to 23° C. over 24 hours. $NH_4OH$ (1 L, 28% in $H_2O$) was added and stirred for 1 hour. The aqueous phase was extracted with DCM (4×200 mL), which was dried over $MgSO_4$ and concentrated in vacuo to give diethyl (3-aminopropyl)phosphonate (C-1, 1.51 g, 7.74 mmol, 46% crude yield). C-1 was carried forward without further purification. $^1$HNMR (400 MHz, $CDCl_3$): δ 4.10 (q, J=6.9, 4H), 2.77 (t, J=6.6, 2H), 1.84-1.66 (m, 4H), 1.32 (t J=7.1, 6H).

B. Preparation of diethyl (3-(pentacosa-10,12-diynamido)propyl) phosphonate (C-2)

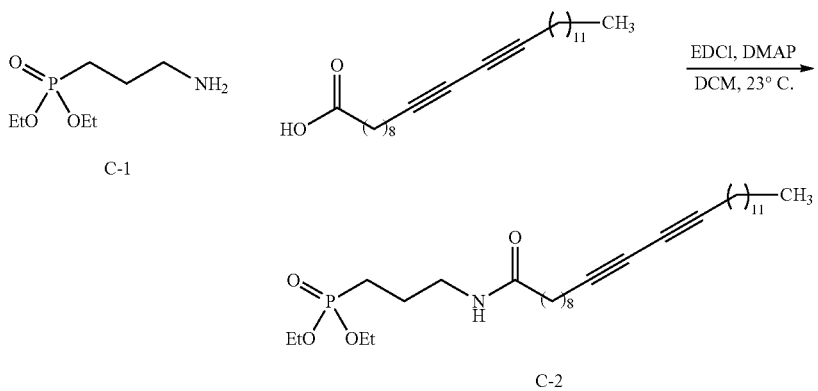

C-1 (0.85 g, 4.32 mmol, 1.0 equivalent) was coupled with 10,12-pentacosadiynoic acid (1.62 g, 4.32 mmol, 1.0 equivalent) using EDCI (0.75 g, 4.8 mmol, 1.1 equivalents) in the presence of DMAP (0.03 g, 0.22 mmol, 5 mol %) in dichloromethane (12 mL, 0.4 M) over 24 hours. The reaction was washed with $H_2O$ (2×200 mL). The organic phase was dried over $MgSO_4$ and then concentrated in vacuo. The crude product was purified by column chromatography (50% EtOAc/Hexanes 5% MeOH/DCM) to generate diethyl (3-(pentacosa-10,12-diynamido)propyl)phosphonate (C-2, 0.63 g, 1.17 mol, 27% yield). $^1$HNMR (400 MHz, $CDCl_3$): δ 6.05 (s, 1H), 4.10 (q, J=7.5, 4H), 3.35 (q, J=6.3, 2H), 2.24 (t, J=6.9, 4H), 2.16 (t, J=7.4, 2H), 1.88-1.71 (m, 4H), 1.56 (m, 37H), 0.88 (t, J=6.9, 3 H).

C. Preparation of (3-(pentacosa-10,12-diynamido)propyl) phosphonic acid (DA)

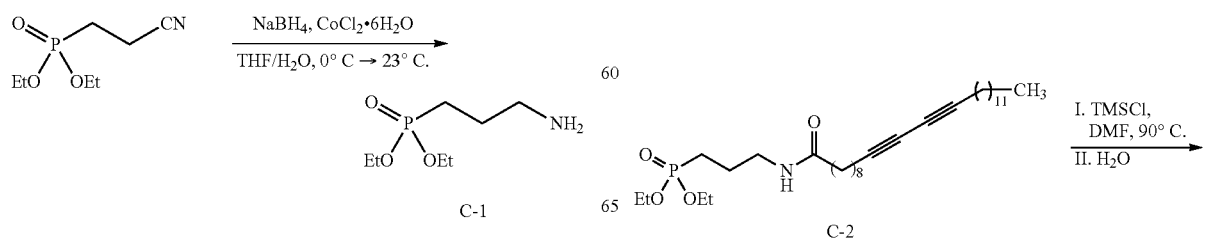

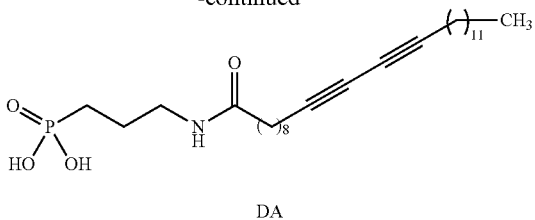

DA

The phosphonate ester C-2 (0.32 g, 0.60 mmol, 1.0 equivalents) was deprotected by forming the trimethylsilyl phosphonate in situ with chlorotrimethylsilane (3.89 g, 35.8 mmol, 60.0 equivalents) in DMF (5 ml, 0.12 M) at 90° C. over 24 hours. Hydrolysis of the trimethylsilyl ester with water produced the desired product DA (0.25 g, 0.50 mol, 84% yield). The crude DA was purified by filtering the crude solid, rinsing the filtered solid with H$_2$O (5 mL), and trituration with DCM (3×5 mL). $^1$HNMR (400 MHz, DMSO-d$_6$): δ 3.04 (q, J=5.8, 4H), 2.27 (t, J=6.8, 4H), 2.02 (t, J=7.7, 2H), 1.63-1.07 (m, 36H), 0.85 (t, J=6.6, 3H).

Triaromatic phosphonic acid compound TP was prepared in four steps from methyl 4-bromobenzoate.

A. Preparation of methyl 4-(dimethoxyphosphoryl)benzoate (C-3)

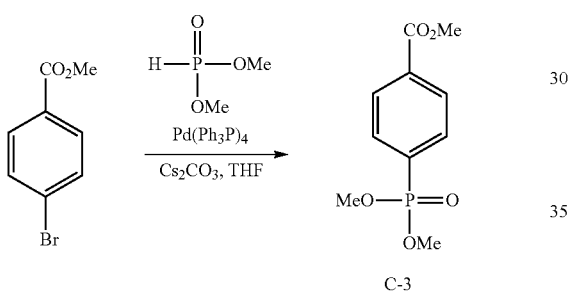

Methyl 4-bromobenzoate (5.0 g, 23 mmol, 1.0 equivalent) was combined with Pd(Ph$_3$P)$_4$ (2.7 g, 2.3 mmol, 0.1 equivalent) and cesium carbonate (9.1 g, 28 mmol, 1.2 equivalents) in tetrahydrofuran (116 mL, 0.2 M) and heated at 80° C. for 18 hours. The reaction mixture was filtered over a plug of celite and the filtrate was concentrated in vacuo. The orange solid was purified by column chromatography (2% MeOH/DCM) to obtain C-3 (1.95 g, 7.99 mmol, 34% yield). $^1$HNMR (400 MHz, CDCl$_3$): δ 8.13 (app dd, J=8.3, 3.9, 2H), 7.88 (app dd, J=13.0, 8.3H), 3.95 (s, 3H), 3.79 (d, J=11.1, 6H).

B. Preparation of 4-(dimethoxyphosphoryl)benzoic acid (C-4)

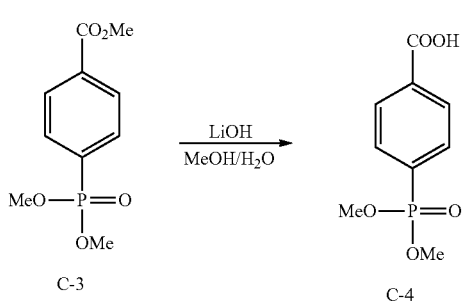

LiOH (0.35 g, 8.39 mmol, 1.05 equivalents) in water (0.1M) was slowly added to methyl 4-(dimethoxyphosphoryl)benzoate (C-3, 1.95 g, 7.99 mmol, 1.0 equivalent) in a 1:1 MeOH/H$_2$O mixture (160 mL, 0.05 M) and stirred at 23° C. for 2 hours. MeOH was removed in vacuo and the aqueous phase was rinsed with EtOAc (2×200 mL) and acidified with 1M HCl (100 mL). The organic phase was extracted with EtOAc (3×100 mL), dried over MgSO$_4$ and concentrated in vacuo to obtain the product C-4 (1.0 g, 4.34 mmol, 54% yield). $^1$HNMR (400 MHz, CDCl$_3$): δ 8.21 (app dd, J=8.5, 3.9, 2H), 7.93 (app dd, J=13.0, 8.5 2 H), 3.82 (d, J=11.2, 6H).

C. Preparation of (3-(pentacosa-10,12-diynamido)propyl) phosphonic acid (DA)

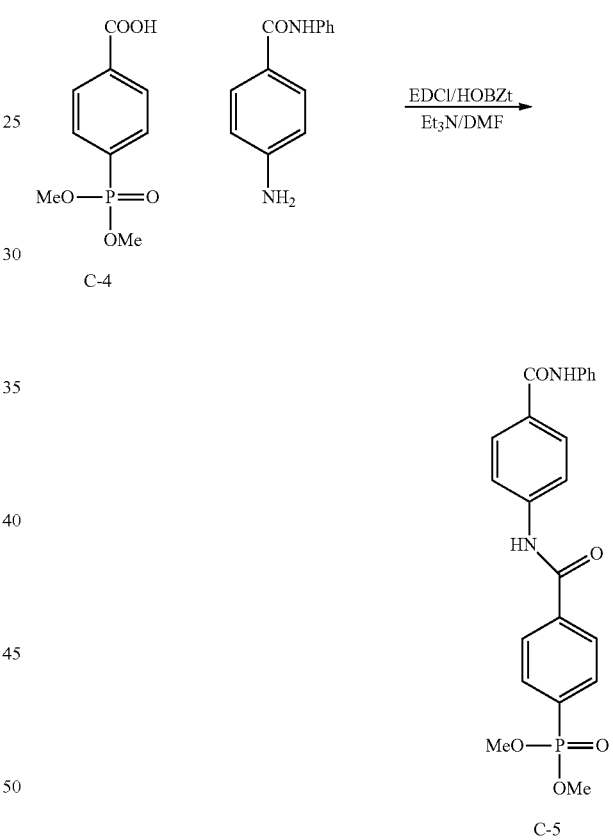

4-Aminobenzanalide (0.41 g, 1.9 mmol, 1.1 equivalents) was added to a stirred solution of 4-(dimethoxyphosphoryl)benzoic acid (C-4, 0.4 g, 1.8 mmol, 1.0 equivalent), 1-ethyl-3-(3-dimethylaminopropyl)carbodiimide hydrochloride (EDCI, 0.4 g, 2.1 mmol, 1.2 equivalents), N-hydroxybenzotriazole (HOBZt, 0.3 g, 2.1 mmol, 1.2 equivalents), and triethylamine (Et$_3$N, 0.25 g, 2.5 mmol, 1.44 equivalents) in DMF (29 mL, 0.06 M). The resulting solution was stirred at 23° C. for 24 hours. The solvent was removed in vacuo and the material was recrystallized from H$_2$O/MeOH to obtain C-5 (0.13 g, 0.31 mmol, 18% yield). $^1$HNMR (400 MHz, DMSO-d6): δ 10.72 (s, 1H), 10.19 (s, 1H), 8.26-7.00 (m, 13H), 3.71 (d, J=11.1, 6H).

D. Preparation of TP

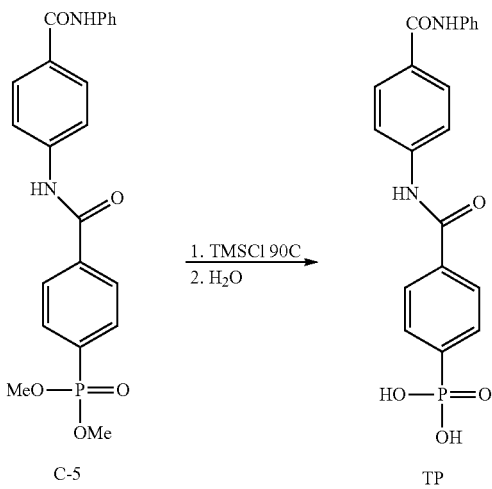

C-5 was deprotected by forming the trimethylsilyl phosphonate in situ with chlorotrimethylsilane (0.77 g, 7.09 mmol, 60.0 equivalents) in DMF (2 mL, 0.06 M) at 100° C. for 1 hour, followed by hydrolysis of the trimethylsilyl ester with water. The resulting precipitate was filtered and rinsed with $H_2O$ (5 mL) and $Et_2O$ (5 mL) to give the desired product TP (0.03 g, 0.08 mmol, 64% yield). $^1$HNMR (400 MHz, DMSO-d6): δ 10.58 (s, 1H), 10.17 (s, 1H), 8.08-7.04 (m, 13H).

The SAM forming materials are listed in Table 2 below.

TABLE 2

| Name | Structure |
|---|---|
| ODPA | (structure) |
| UODPA | (structure) |
| DA | (structure) |
| SA | (structure) |
| HODA | (structure) |
| MHODA | (structure) |
| PFDA | (structure) |
| TP | (structure) |
| DC | (structure) |

Contact Angles

Contact angles of various SAMs were measured as a function of immersion time and on various surfaces including metals (Cu, Sn, Zn, V) and silicon surfaces (native $SiO_2$, SiN). All SAM solutions were prepared as a 0.1 wt. % solution in the solvent 4-methyl-2-pentanol then filtered through a 0.2 micrometer PTFE syringe filter. Surfaces were cleaned by an oxygen plasma immediately before coating. It should be understood that the metal surfaces contained metal oxides when cleaned in this manner. All coatings were carried out at room temperature unless otherwise specified.

Table 3 lists the contact angles obtained for various initial SAM layers formed on the different metal surfaces at room temperature (i.e., before irradiating the SAM layer). A larger contact angle is desirable, and indicates the SAM forming material is bound to the metal surface.

TABLE 3

| Metal Surface | SAM material | Time of contact | Average Contact Angle (°) |
|---|---|---|---|
| Cu | None | | 30-40 |
| Cu | ODPA | 2-14 minutes | 100-105 |
| | | 72 hours | 100-110 |
| Cu | SA | 2-16 minutes | 80-102 |
| | | 72 hours | 104-110 |
| Cu | DA | 24 hours/65 C. | 104 |
| Cu | UODPA | 2-15 minutes | 103 |
| | | 72 hours | |
| Cu | PFDA | 2-16 minutes | 95-110 |
| Cu | HODA | 2-14 minutes | 100-110 |
| Cu | MHODA | 2-14 minutes | 80-100 |
| Cu | TP | Up to 72 hrs | 65-71 |
| Cu | DC | 18 | 107 |
| Sn | None | | <5 |
| Sn | ODPA | 10 minutes | 130-138 |
| Sn | PFDA | 10 minutes | 80-90 |
| Sn | SA | 12 minutes | 100-120 |
| $SiO_2$ | None | | 7 |

TABLE 3-continued

| Metal Surface | SAM material | Time of contact | Average Contact Angle (°) |
|---|---|---|---|
| SiO$_2$ | ODPA | 20 minutes | 30-32 |
| SiO$_2$ | PFDA | 20 minutes | 35 |
| SiO$_2$ | SA | 30 minutes | 27 |
| SiO$_2$ | HODA | 20 minutes | 45 |
| SiN | None | | 18 |
| SiN | ODPA | 30 minutes | 43 |
| SiN | PFDA | 20 minutes | 35 |
| SiN | SA | 30 minutes | 35 |
| SiN | HODA | 30 minutes | 33 |

The results in Table 3 show that ODPA, SA, DA and PFDA selectively form SAMs on copper and tin surfaces. The SAMs have similar contact angles in the range of 80-110 degrees on these surfaces. Lower contact angles (e.g., on SiO$_2$ and SiN surfaces) indicate poor SAM formation on these surfaces.

ALD Studies

A 50 nm thick Cu film was evaporated onto a four inch reclaimed silicon wafer using a circular shadow mask that protected a portion of the native SiO$_2$ surface from Cu deposition. After breaking the vacuum, the Cu layer grew a native oxide layer on the surface (i.e., CuO and/or Cu$_2$O). The wafer was then soaked in a solution of (3-(pentacosa-10,12-diynamido)propyl)phosphonic acid (DA) in dimethyl sulfoxide (0.5 mg/mL, reagent grade) at 65° C. for 24 hours, then rinsed with isopropanol and dried using constant flow of nitrogen. The contact angle for the SAM was 104°, indicating formation of a well assembled SAM on the Cu surface. The wafer was heated to 120° C. under a nitrogen atmosphere to promote esterification of the phosphonic acid with the metal oxides. The contact angle for the SAM was then measured to be 104°, indicating the SAM was not desorbed from the Cu film.

The wafer was split into two halves. One half was irradiated with 254 nm ultraviolet light for 5 minutes (i.e., the area without SAM and the area with SAM of the half wafer were irradiated). The contact angle of the SAM post-irradiation was 101°, indicating negligible desorption of the SAM from the Cu surface. The two wafer halves were then loaded into an ALD chamber. The ZnO deposition used dimethyl zinc as the organometallic precursor for ZnO. In this procedure, the ALD process was performed at 150° C. with a continuous flow of Ar to achieve a base pressure of 140 mT. A 0.015 second pulse of water was followed by a pause of 20 seconds, followed by a 0.015 second pulse of dimethyl zinc, followed by another 20 second pause, followed by evacuation of any unreacted dimethyl zinc. This procedure represents one ALD cycle. The ZnO film thickness obtained after each cycle was about 0.12 nm. Coupons of each half were removed from the ALD chamber after every 100 cycles for a total of 10 coupons or 1000 ALD cycles.

The coupons were then characterized by Rutherford backscattering spectrometry (RBS) to measure surface composition of the wafer portion having no SAM (i.e., areas having a SiO$_2$ surface). In both instances, the ZnO composition increased immediately above the SiO$_2$ surface, consistent with the growth of ZnO film. Negligible difference was observed with respect to ZnO deposition on the SiO$_2$ surface of the non-photoirradiated and photoirradiated halves of the wafer, summarized in Table 2.

TABLE 2

| # of ALD cycles | ZnO on SiO$_2$ portion of non-photoirradiated half of wafer | | | ZnO on SiO$_2$ portion of photoirrradiated half of wafer | | |
|---|---|---|---|---|---|---|
| | [Zn] atom % | [O] atom % | thickness (Å) | [Zn] atom % | [O] atom % | thickness (Å) |
| 200 | 46.1 ± 3 | 53.9 ± 3 | 195 ± 10 | 51.3 ± 3 | 48.7 ± 3 | 183 ± 10 |
| 400 | 50.1 ± 3 | 49.9 ± 3 | 449 ± 20 | 49.9 ± 3 | 50.1 ± 3 | 456 ± 20 |
| 600 | 50.3 ± 3 | 49.7 ± 3 | 749 ± 50 | 48.4 ± 3 | 51.6 ± 3 | 721 ± 50 |
| 800 | 48.6 ± 3 | 51.4 ± 3 | 1100 ± 100 | 50.4 ± 3 | 49.8 ± 3 | 1000 ± 100 |
| 1000 | 48.8 ± 3 | 51.2 ± 3 | 1385 ± 100 | 49 ± 3 | 51 ± 3 | 1299 ± 100 |

On the SAM portion of the wafer halves, PUCE (Particle-induced X-ray emission) analysis was used to determine minor quantities of ZnO nucleation. The detection limit was 0.1 monolayer of ZnO. The non-photoirradiated SAM of DA (Example 1, Table 3 below) showed no detectable ZnO up to 800 ALD cycles. After 1000 cycles, 47 Å of ZnO was detected. Therefore, the maximum number of ALD cycles for the non-photoirradiated SAM of DA was between 800-1000 cycles. For the photoirradiated SAM of DA (Example 8, Table 3 below), no ZnO was detected after 1000 ALD cycles. Therefore, the maximum number of ALD cycles for the irradiated SAM of DA is 1000 or more cycles. While the non-photoirradiated SAM of DA is a strong deactivation barrier, the photoirradiated SAM of DA was even more deactivating against ZnO deposition.

Pre-Patterned Substrate Containing Embedded Cu Line Pattern

Figure 5:
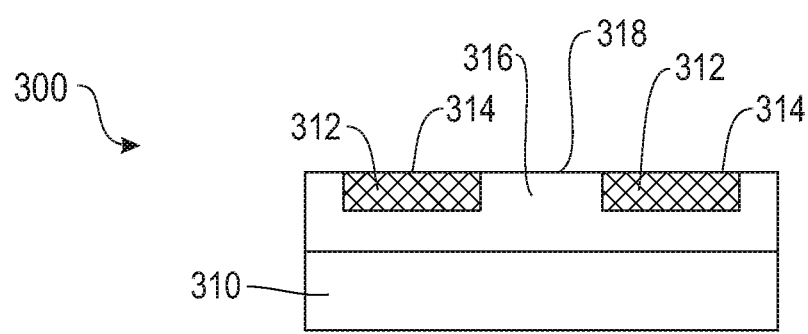
FIG. 5 is a cross-sectional layer diagram showing a pre-patterned substrate containing an embedded Cu line pattern.

This substrate used to form the SAM is depicted in FIG. 5. Substrate 300 comprises a Cu line pattern 312 having top surfaces 314. Cu line pattern 312 is embedded in a dielectric layer 316, which was prepared from octamethylcyclotetrasiloxane (OMCTS) and has top surface 318 comprising SiO$_2$. Top surface 314 of the Cu line pattern 312 contains oxides of copper. Top surface 314 of the Cu line pattern 312 is also coplanar with top surface 318 of dielectric layer 316. Bottom layer 310 of substrate 300 was a silicon wafer.

ALD Results

The procedure for ZnO deposition is described above.

The organometallic precursor for HfO$_2$ deposition was TDHf tetrakis(dimethylamino)hafnium (IV). The ALD process for HfO$_2$ deposition was performed at 70° C. with a continuous flow of Ar to achieve a base pressure of 200 mT. A 0.25 second pulse of TDHf was followed by a pause of 240 seconds, followed by a 0.06 second pulse of water, followed by a 240 second pause, followed by evacuation of any unreacted TDHf.

The organometallic precursor for TiO$_2$ deposition was TDTi tetrakis(dimethylamino)titanium (IV). The ALD process for TiO$_2$ deposition was performed at 150° C. with a continuous flow of Ar to achieve a base pressure of 220 mT. A 0.06 second pulse of water was followed by a pause of 10 seconds, followed by a 0.1 second pulse of TDTi, followed by a 10 second pause, followed by evacuation of any unreacted TDTi.

The SAM-forming compounds were screened for deactivation of oxygen plasma-cleaned Cu surfaces using the above-described general procedures. The results are summarized in Table 3. "Maximum ALD cycles" refers to the number of cycles before unwanted ALD deposition occurred on the deactivated copper surface. A higher number of maximum ALD cycles is desired.

TABLE 3

| Example | SAM Component | Deactivated Surface | SAM Photoirradiated? (Y/N) | ALD Precursor | ALD Product | ALD target Surface | Maximum ALD Cycles |
|---|---|---|---|---|---|---|---|
| 1 | DA | Cu | N | Me$_2$Zn | ZnO | SiO$_2$ | 800-1000 |
| 2 | ODPA | Cu | N | Me$_2$Zn | ZnO | SiO$_2$ | 600 |
| 3 | UODPA | Cu | N | Me$_2$Zn | ZnO | SiO$_2$ | 800 |
| 4 | HODA | Cu | N | Me$_2$Zn | ZnO | SiO$_2$ | 600 |
| 5 | MHODA | Cu | N | Me$_2$Zn | ZnO | SiO$_2$ | 200 |
| 6 | DA | Cu | Y | Me$_2$Zn | ZnO | SiO$_2$ | >1000 |
| 7 | ODPA | Cu | Y | Me$_2$Zn | ZnO | SiO$_2$ | 600 |
| 8 | DC | Cu | Y | Me$_2$Zn | ZnO | SiO$_2$ | Note 1 |
| 9 | ODPA | Cu | N | TDTi | TiO$_2$ | SiO$_2$ | <100 |
| 10 | DA | Cu | Y | TDTi | TiO$_2$ | SiO$_2$ | <100 |
| 11 | ODPA | Cu | N | TDHf | HfO$_2$ | SiO$_2$ | <100 |
| 12 | DA | Cu | Y | TDHf | HfO$_2$ | SiO$_2$ | <100 |
| 13 | ODPA | Cu | N | TDHf | HfO$_2$ | SiO$_2$ (Note 2) | <100 |
| 14 | DA | Cu | N | TDHf | HfO$_2$ | SiO$_2$ (Note 2) | <100 |

Note 1:
ALD was not performed because a large decrease in contact angle was observed after irradiation.

Note 2:
pre-patterned substrate prepared using OMCTS.

The results in Table 3 show that non-photoirradiated ODPA (Example 2) and photoirradiated ODPA (Example 7) performed comparably, each having a maximum number of ALD cycles of 600. ODPA Examples 2 and 7 were also less deactivating compared to non-photoirradiated DA (Example 1, 800-1000 cycles). ODPA Examples 2 and 7 were also less deactivating compared to non-photoirradiated urea compound UODPA (Example 3, 800 cycles). UODPA Example 3 was slightly less deactivating compared to non-photoirradiated DA (Example 1, 800-1000 cycles), indicating the urea hydrogen bond-forming group of UODPA and the amide hydrogen bond-forming group of DA have similar influence on the deactivation of the SAM surface to ZnO deposition. The least effective deactivation was obtained with SAM-forming compounds that did not contain the phosphonic acid head group, a hydrogen-bond forming group, and a polymerizable group (Examples 4-5). The most effective compound was photoirradiated DA (Example 6, >1000 cycles).

Although DC (Example 10) formed an initial SAM, the initial SAM did not retain a high contact angle upon photoirradiation. Without wishing to be bound by theory, it is believed the diacetylenic groups of the initial SAM could not properly align for polymerization. This example points to the importance of hydrogen bonding groups to provide proper alignment and stability of the polymerizable group.

When the ALD product was TiO$_2$, no deactivation of Cu surfaces was observed using photoirradiated DA (Example 10) and non-photoirradiated ODPA (Example 9) relative to the SiO$_2$ surface. TiO$_2$ was formed on both surfaces.

Figure 3:
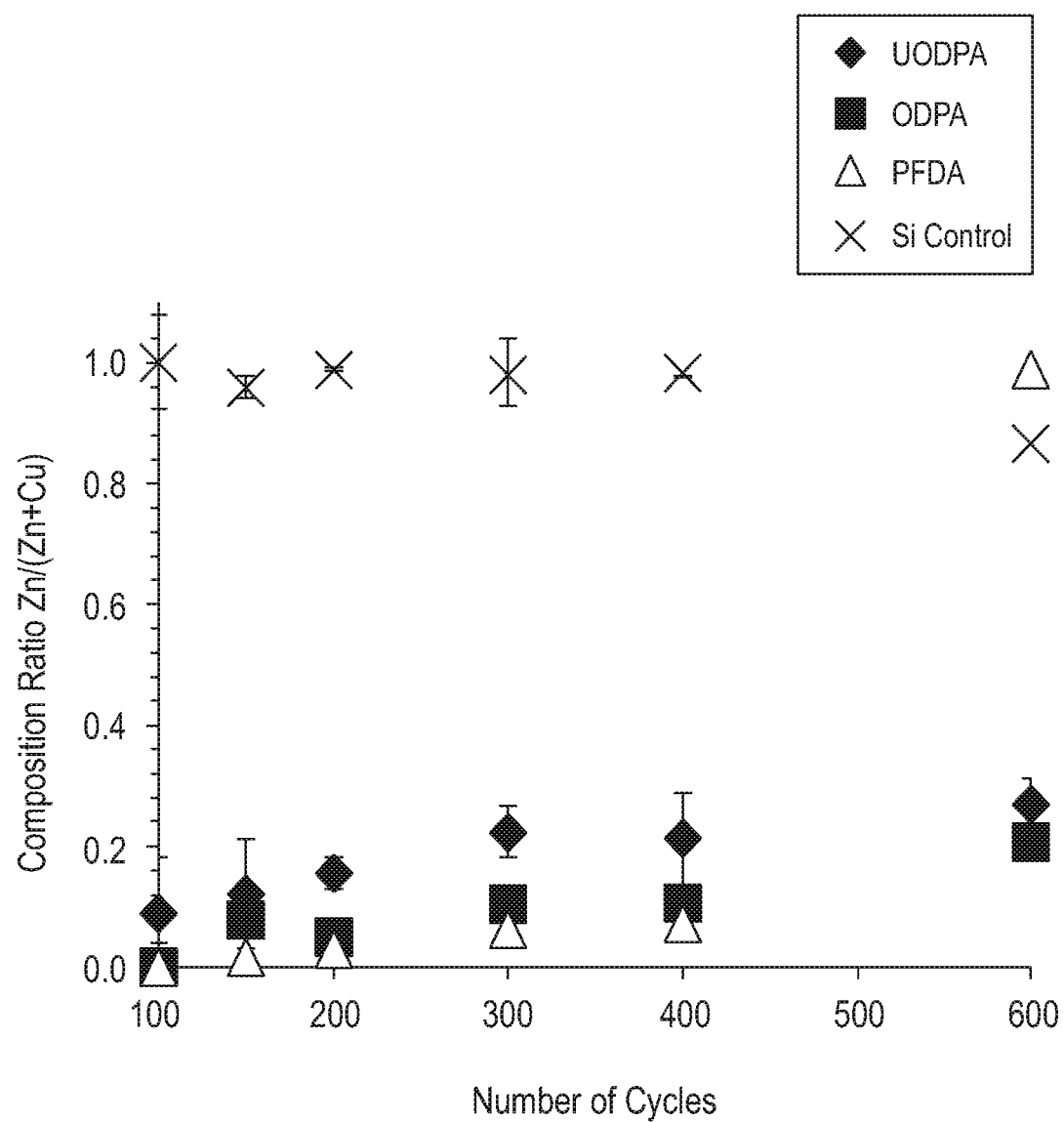
FIG. 3 is a graph comparing the performance of self-assembled monolayers (SAMs) formed by UODPA, ODPA, and PFDA in blocking atom layer deposition of zinc oxide on a copper surface.

FIG. 3 is a graph comparing the performance of UODPA, ODPA, and PFDA SAMs in blocking ALD of zinc oxide on a copper surface. A desired Zn/Zn+Cu composition ratio is zero. A maximum of 600 ALD cycles is shown, beyond which each SAM displayed unacceptably high levels of zinc nucleation on the SAM.

Figure 4:
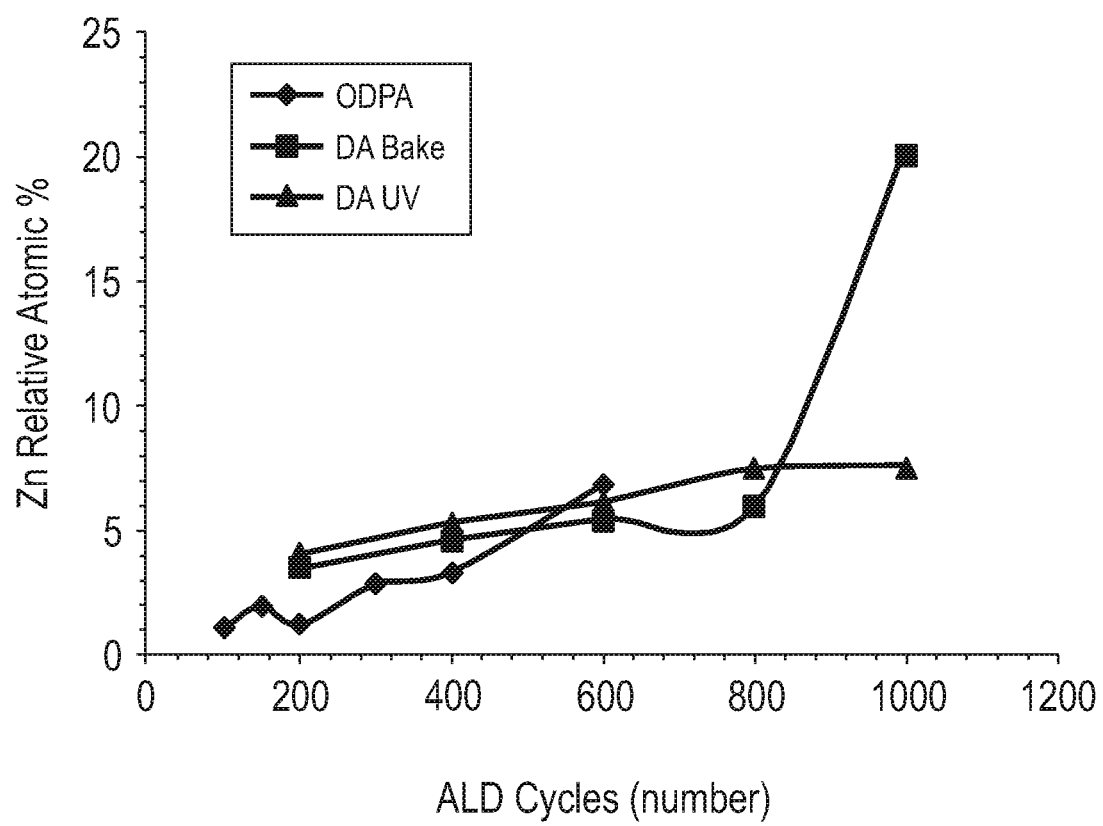
FIG. 4 is a graph comparing the performance of SAMs formed by DA and ODPA in blocking ALD of zinc oxide on a copper surface.

FIG. 4 is a graph comparing the performance of SAMs formed by DA and ODPA in blocking ALD of zinc oxide on a copper surface. One SAM of DA was given only a bake before ALD, another was polymerized by UV irradiation before ALD. The UV irradiated DA SAM showed substantially less zinc deposition after 1000 ALD cycles compared to the baked DA SAM, which allowed a maximum of 800 ALD cycles. The ODPA allowed a maximum of 600 ALD cycles. The results indicate that the hydrogen bonding group of DA enhances selectivity of the DA SAM relative to the ODPA SAM (maximum of 800 cycles versus 600 cycles, respectively), and a further enhancement in selectivity of the DA SAM is obtained when the diacetylene group is polymerized by UV irradiation (≥1000 cycles).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
   disposing a self-assembled monolayer, designated SAM, on a portion of a surface of a substrate, thereby forming a masked portion of the surface while leaving a portion of the surface unmasked, the SAM comprising a bound form of a compound of formula (1):

   (1)

wherein
a is 1 or 2,
H' is a head group comprising a functional group capable of binding to said portion of the surface by electrostatic interactions and/or a covalent bond,
T' is a tail group covalently linked to the head group, the tail group comprising a hydrogen-bond-forming functional group, a polymerizable butadiyn-1,4-diyl group (*—C≡C—C≡C—*), and a non-polar peripheral end group;
exposing the SAM to a radiation, thereby forming a polymerized SAM; and
depositing material selectively onto the unmasked portion of the surface using a process of atomic layer deposition, thereby forming a layered structure.

2. The method of claim 1, wherein a is 1.
3. The method of claim 1, wherein the head group H' comprises a member of the group consisting of phosphonic acid group (*—P(=O)(—OH)$_2$ and salts thereof, carboxylic acid group (*—C(=O)OH) and salts thereof, sulfonic acid group (*—S(=O)$_2$OH) and salts thereof, sulfinic acid group (*—S(=O)OH) and salts thereof, alcohol (*—OH), thiol (*—SH), alkene (*—C=C—*), alkyne (*—C≡C—*), silanes, and combinations thereof.
4. The method of claim 1, wherein the hydrogen bond-forming group comprises a functional group selected from the group consisting of amide, urethane, urea, and combinations thereof.
5. The method of claim 1, wherein the hydrogen bond-forming group is an amide.
6. The method of claim 1, wherein the hydrogen bond-forming group is a urethane.
7. The method of claim 1, wherein the compound comprises no rings.
8. The method of claim 1, wherein the SAM has a non-polar top surface.
9. The method of claim 1, wherein the masked portion of the surface of the substrate contains an oxide of copper.
10. The method of claim 1, wherein the unmasked portion of the surface of the substrate contains SiO$_2$.
11. The method of claim 1, wherein the non-polar peripheral end group comprises carbon and a member selected from the group consisting of hydrogen, fluorine, and combinations thereof.
12. The method of claim 1, wherein the SAM is formed by contacting the substrate with a solution comprising the compound dissolved in a solvent, wherein the compound selectively adsorbs to the portion of the substrate.
13. The method of claim 1, wherein the compound has a structure according to formula (3):

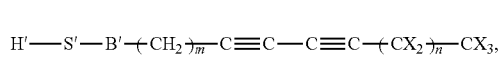   (3)

wherein
m is a positive integer having a value of 4 to 20,
n is a positive integer having a value of 0 to 19,
H' is a head group comprising a functional group capable of binding to a given selected top surface of a substrate by electrostatic interactions and/or a covalent bond,
S' is a spacer group comprising at least one carbon,
B' is a moiety comprising a hydrogen bond-forming group, and
each X is an independent substituent selected from the group consisting of hydrogen and fluorine.

14. The method of claim 13, wherein B' is selected from the group consisting of amide groups, urethane groups, and urea groups.
15. A method, comprising:
disposing a self-assembled monolayer, designated SAM, on a surface of a substrate, the SAM comprising a bound form of a compound of formula (1):

   (1)

wherein
a is 1 or 2,
H' is a head group comprising a functional group capable of binding to said portion of the surface by electrostatic interactions and/or a covalent bond,
T' is a tail group covalently linked to the head group, the tail group comprising a hydrogen-bond-forming functional group, a polymerizable butadiyn-1,4-diyl group (*—C≡C—C≡C—*), and a non-polar peripheral end group;
exposing the SAM pattern-wise to radiation, thereby forming a patterned SAM comprising exposed SAM and non-exposed SAM, the exposed SAM comprising a polymerized form of the compound;
selectively removing the non-exposed SAM, thereby forming unmasked regions of the surface of the substrate; and
depositing a material selectively onto the unmasked regions of the substrate using a process of atomic layer deposition.

16. The method of claim 15, wherein said exposing the SAM is performed using ultraviolet light.
17. A method, comprising:
disposing a self-assembled monolayer on a portion of a substrate, thereby forming a masked portion of the substrate while leaving a portion of the substrate unmasked, wherein the self-assembled monolayer includes a photopolymerizable butadiyn-1,4-diyl moiety (*—C≡C—C≡C—*), and a hydrogen bond-forming moiety; and
depositing material selectively onto the unmasked portion of the substrate using a process of atomic layer deposition.

18. The method of claim 17, wherein the method comprises photopolymerizing the self-assembled monolayer, thereby enhancing the selectivity of the masked portion during atomic layer deposition.
19. The method of claim 17, wherein the hydrogen bond-forming moiety enhances the selectivity of the masked portion during atomic layer deposition.

* * * * *